US009081370B2

(12) United States Patent
Dosho

(10) Patent No.: US 9,081,370 B2
(45) Date of Patent: Jul. 14, 2015

(54) TIME-TO-DIGITAL CONVERTER AND AN A/D CONVERTER INCLUDING THE SAME

(71) Applicant: PANASONIC CORPORATION, Osaka (JP)

(72) Inventor: Shiro Dosho, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/452,629

(22) Filed: Aug. 6, 2014

(65) Prior Publication Data

US 2014/0347205 A1    Nov. 27, 2014

Related U.S. Application Data

(63) Continuation of application No. PCT/JP2013/000289, filed on Jan. 22, 2013.

(30) Foreign Application Priority Data

Feb. 29, 2012  (JP) ................. 2012-043210

(51) Int. Cl.
  *H03M 1/50* (2006.01)
  *G04F 10/00* (2006.01)
  *G04F 10/06* (2006.01)
  *H03K 5/26* (2006.01)

(52) U.S. Cl.
  CPC ............. *G04F 10/005* (2013.01); *G04F 10/06* (2013.01); *H03K 5/26* (2013.01)

(58) Field of Classification Search
  CPC .......... G04F 10/005; G04F 10/06; H03K 5/26
  USPC ...................................... 341/166
  See application file for complete search history.

(56) References Cited

U.S. PATENT DOCUMENTS 8,446,302 B2 * 5/2013 Miyashita ............. 341/111
8,564,471 B1 * 10/2013 Gao et al. ............. 341/166
8,618,967 B2 * 12/2013 Nikaeen et al. ........ 341/143
8,810,440 B2 * 8/2014 Wu et al. ............... 341/109

FOREIGN PATENT DOCUMENTS

JP    61-227422 A    10/1986
JP    04-373210 A    12/1992

OTHER PUBLICATIONS

Masao, Takayama, et al.: "A Time-Domain Architecture and Design Method of High Speed A-to-D Converters with Standard Cells", IEEE Asian Solid-State Circuits Conference, Nov. 14-16, 2011, pp. 353-356.
International Search Report issued in PCT/JP2013/000289, dated Feb. 19, 2013, with English translation.

* cited by examiner

*Primary Examiner* — Brian Young
(74) *Attorney, Agent, or Firm* — McDermott Will & Emery LLP

(57) ABSTRACT

A time-to-digital converter includes first and second phase distribution circuits and N time-to-digital conversion circuits. The first and second phase distribution circuits each includes a plurality of frequency dividers connected in a tree structure. The first and second phase distribution circuits each divides a signal received by the frequency dividers of root nodes into N signals. The first and second phase distribution circuits each outputs the N signals each having a different phase. The N time-to-digital conversion circuits each converts a phase difference between an i-th signal (where i is an integer from 0 to N−1) that is output from the first phase distribution circuit and another i-th signal that is output from the second phase distribution circuit into a digital value.

5 Claims, 7 Drawing Sheets

TIME-TO-DIGITAL CONVERTER AND AN A/D CONVERTER INCLUDING THE SAME

CROSS-REFERENCE TO RELATED APPLICATIONS

This is a continuation of International Application No. PCT/JP2013/000289 filed on Jan. 22, 2013, which claims priority to Japanese Patent Application No. 2012-043210 filed on Feb. 29, 2012. The entire disclosures of these applications are incorporated by reference herein.

BACKGROUND

The present disclosure relates to a time-to-digital converter for digitizing the analog information of the time direction. The present disclosure also relates to an analog-to-digital (A/D) converter for converting an analog signal to the time axis information and converting it into digital form.

The recent finer designs of LSIs have reduced their operating voltages. Thus, the signal processing of the voltage direction is less likely to improve a signal-to-noise (S/N) ratio of the signal. Thus, the signal processing requires the analog quantity of the time axis direction, or the time axis information. This time axis information is an interval between edges of clock signals. This interval, i.e., the phase difference is modulated with an information signal. The system for the signal processing of the time axis information that is superimposed on the clock edges includes the signal processing of the time direction. This system has shorter time for the signal processing with a higher frequency of the clock signals on which the time axis information is superimposed. A typical technique for securing the time for signal processing is to distribute the time axis information signal to parallel systems and process them individually. One example of the known techniques is to distribute the time axis information to individual signal processing systems with a synchronous counter. See, e.g., Non-Patent Document 1.

Non-Patent Document 1: M. Takayama, S. Dosho, N. Takeda, M. Miyahara, and A. Matsuzawa, "A Time-Domain Architecture and Design Method of High Speed A-to-D Converters with Standard Cells," IEEE Asian Solid-State Circuits Conference, Nov. 14, 2011, pp. 353-356

Non-Patent Document 1 discloses a typical technique for distributing signals with a synchronous counter. The technique requires heavy power consumption. This technique also has considerable difficulty in providing a physical layout of equal-length wiring for distributing the signal to individual signal processing systems.

Therefore, it is necessary to provide a time-to-digital converter operating with low power consumption and having an appropriate physical layout, and an A/D converter including this time-to-digital converter.

SUMMARY

The time-to-digital converter of one aspect of the present disclosure includes first and second phase distribution circuits and N time-to-digital conversion circuits. The first and second phase distribution circuits each includes a plurality of frequency dividers connected in a tree structure. The first and second phase distribution circuits each divides a signal received by the frequency dividers of root nodes into N signals. The first and second phase distribution circuits each outputs the N signals each having a different phase. The N time-to-digital conversion circuits each converts a phase difference between an i-th signal (where i is an integer from 0 to N−1) that is output from the first phase distribution circuit and another i-th signal that is output from the second phase distribution circuit into a digital value.

In this manner, the first and second phase distribution circuits each includes the plurality of frequency dividers that are connected in a tree structure. The frequency dividers of lower child nodes have lower operating frequencies. Thus, the phase distribution circuits can operate with low power consumption. The frequency dividers in a tree structure easily provide an appropriate physical layout.

The A/D converter of another aspect of the present disclosure includes the above time-to-digital converter and an analog-to-time converter. The analog-to-time converter converts an analog quantity of an input signal into a phase difference between two signals. The analog-to-time converter outputs the two signals. One of the two signals is input to the first phase distribution circuit of the time-to-digital converter. The other one of the two signals is input to the second phase distribution circuit of the time-to-digital converter.

DETAILED DESCRIPTION

Embodiments of the present disclosure will be described below with reference to the drawings.

First Embodiment

Figure 1:
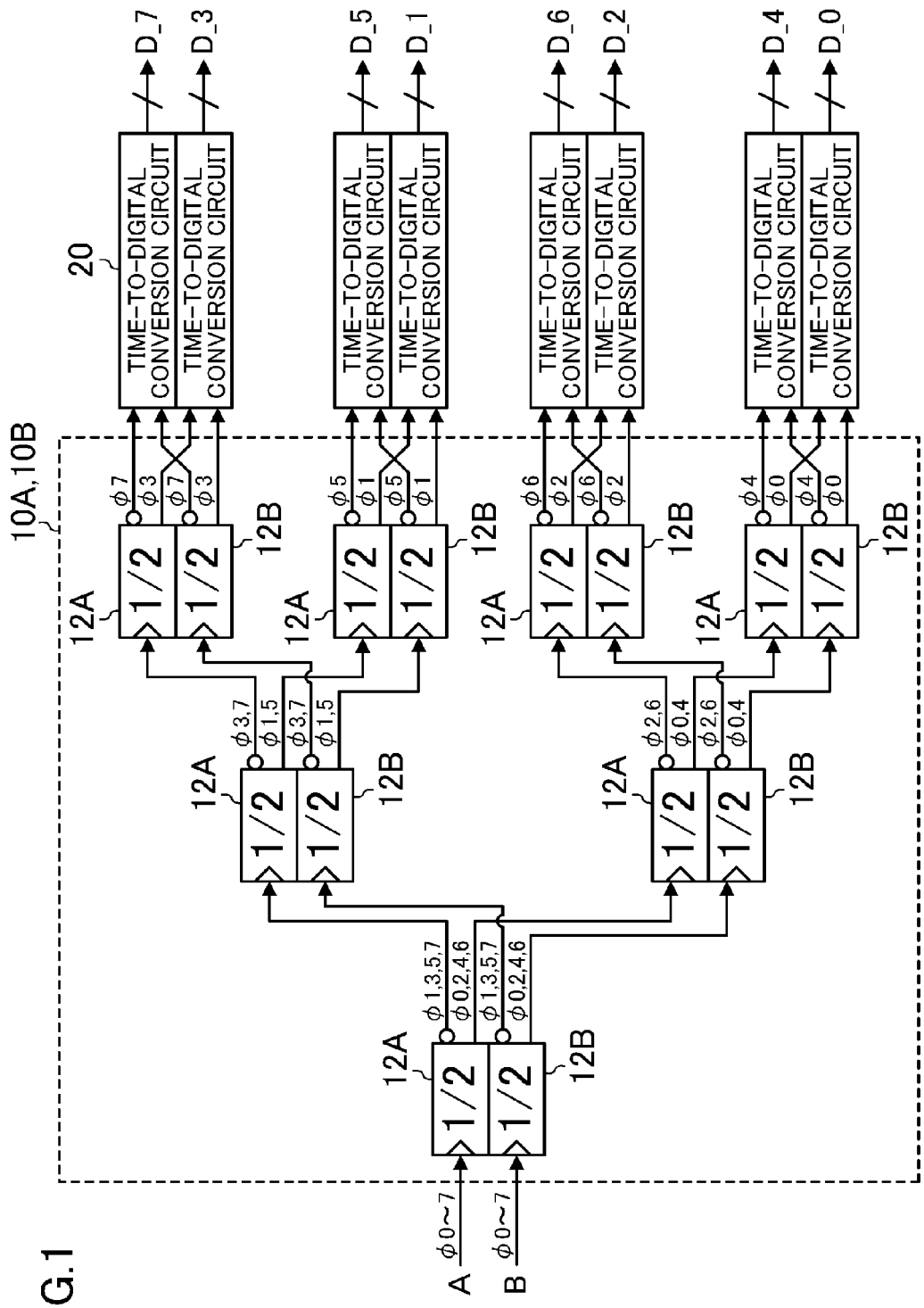
FIG. 1 is a block diagram of a time-to-digital converter of a first embodiment.

FIG. 1 illustrates a configuration of a time-to-digital converter of a first embodiment. The time-to-digital converter of this embodiment includes two phase distribution circuits 10A and 10B and eight time-to-digital conversion circuits 20.

The phase distribution circuit 10A includes a plurality of divide-by-two dividers 12A. The divide-by-two dividers 12A are connected in a tree structure. Specifically, one of the divide-by-two dividers 12A of the phase distribution circuit 10A distributes an in-phase output and a reverse phase output to other two of the divide-by-two dividers 12A of child nodes. A signal A input to the divide-by-two dividers 12A of root nodes is divided into eight, and eight signals each having a different phase are output from four of the divide-by-two dividers 12A of leaf nodes.

Similarly, the phase distribution circuit 10B includes a plurality of divide-by-two dividers 12B. The divide-by-two dividers 12B are connected in a tree structure. Specifically, one of the divide-by-two dividers 12B of the phase distribution circuit 10B distributes an in-phase output and a reverse phase output to other two of the divide-by-two dividers 12B of child nodes. A signal B input to the divide-by-two dividers 12B of root nodes is divided into eight, and eight signals each having a different phase are output from four of the divide-by-two dividers 12B of leaf nodes.

The divide-by-two dividers 12A and 12B each may be, e.g., a D flip-flop including a reverse output connected with a data input. The D flip-flop synchronizes with an input signal and latches the data input.

Figure 2:
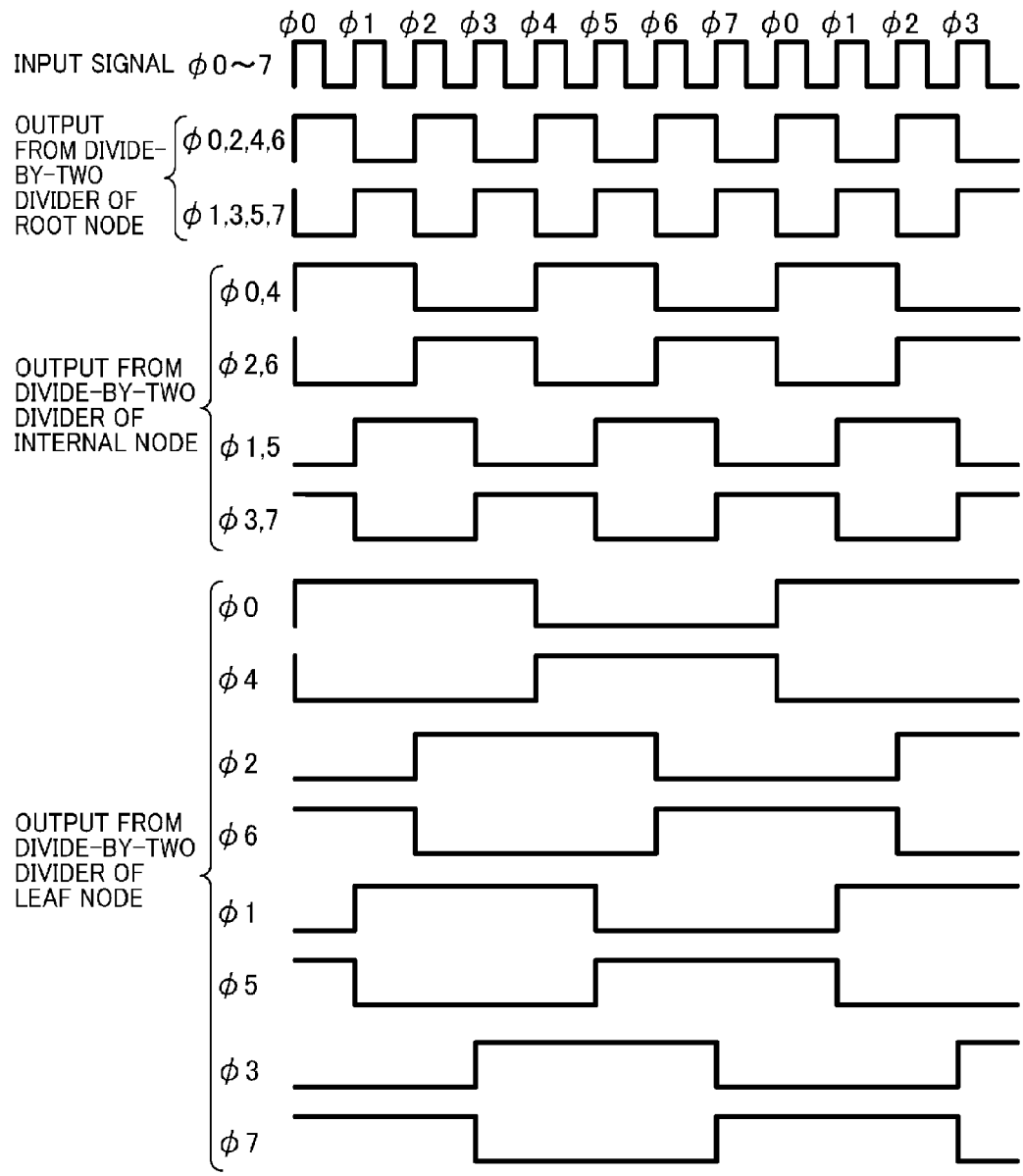
FIG. 2 is a timing diagram of a phase distribution circuit of the time-to-digital converter in FIG. 1.

FIG. 2 is a timing diagram of the phase distribution circuits 10A and 10B. The phase distribution circuits 10A and 10B operate in the same way. In particular, the operation of the phase distribution circuit 10A will be described. Edges φ0-7 periodically appear on the signal A, which is an input signal. One of the divide-by-two dividers 12A of root nodes divides the signal A of the edges φ0-7 to a signal of φ0, 2, 4, 6 and a signal of φ1, 3, 5, 7. One of the divide-by-two dividers 12A of child nodes divides the signal of φ0, 2, 4, 6 to a signal of φ0, 4 and a signal of φ2, 6. Another one of the divide-by-two dividers 12A of child nodes divides the signal of φ1, 3, 5, 7 to a signal of φ1, 5 and a signal of φ3, 7. One of the divide-by-two dividers 12A of leaf nodes of child nodes divides the signal of φ0, 4 to a signal of φ0 and a signal of φ4. Another one of the divide-by-two dividers 12A of leaf nodes divides the signal of φ2, 6 to a signal of φ2 and a signal of φ6. Another one of the divide-by-two dividers 12A of leaf nodes divides the signal of φ1, 5 to a signal of φ1 and a signal of φ5. The other one of the divide-by-two dividers 12A of leaf nodes divides the signal of φ3, 7 to a signal of φ3 and a signal of φ7. In this way, the divide-by-two dividers 12A of root nodes receive the signal A and divide it into eight. That is, the edges φ0-7 on the signal A are distributed to the eight signals.

Referring back to FIG. 1, the time-to-digital conversion circuits 20 each includes two input ports connected with a pair of signals that are output from the phase distribution circuits 10A and 10B. This pair of signals have the same edge number. Specifically, the time-to-digital conversion circuits 20 each converts a phase difference to a digital value. This phase difference is between the signals of φi (where i is an integer from 0 to 7) that are output from the phase distribution circuits 10A and 10B. Then, the time-to-digital conversion circuits 20 each outputs the digital value as a digital signal D_i. The time-to-digital conversion circuit 20 may have any configuration and resolution.

As described above, in the time-to-digital converter of this embodiment, the divide-by-two dividers 12A and 12B are connected in a tree structure to form the phase distribution circuits 10A and 10B, respectively, thereby the divide-by-two dividers 12A and 12B of lower child nodes have a lower operating frequency reduced by half. Thus, the phase distribution circuits 10A and 10B can operate with low power consumption. The divide-by-two dividers 12A and 12B in a tree structure also easily provide equal-length wiring. Thus, the edges can be distributed without offset errors unnecessary for the time axis signal. The time-to-digital conversion circuit 20 also receives a signal of a 50% duty cycle, and thus easily secures a settling time.

Second Embodiment

Figure 3:
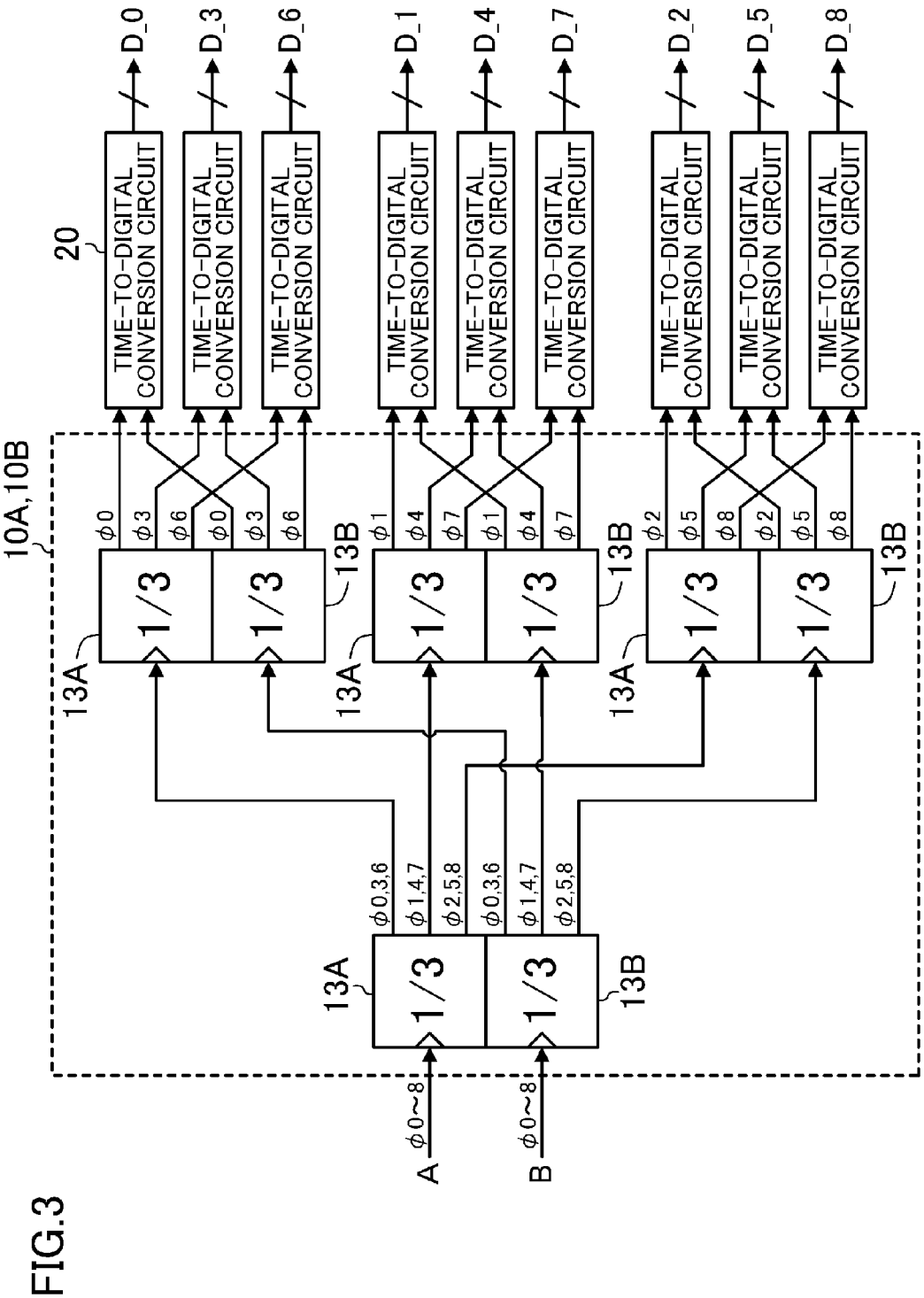
FIG. 3 is a block diagram of a time-to-digital converter of a second embodiment.

FIG. 3 illustrates a configuration of a time-to-digital converter of a second embodiment. The time-to-digital converter of this embodiment includes phase distribution circuits 10A and 10B that differ from those of the first embodiment. In particular, the differences from the first embodiment will be described below.

The phase distribution circuit 10A includes a plurality of divide-by-three dividers 13A. The divide-by-three dividers 13A are connected in a tree structure. Specifically, one of the divide-by-three dividers 13A of root nodes of the phase distribution circuit 10A outputs three signals each having a phase that is shifted by 2π/3 from one another. Then, the other three of the divide-by-three dividers 13A of leaf nodes of child nodes receive the three signals. A signal A input to the divide-by-three dividers 13A of root nodes is divided into nine, and nine signals each having a different phase are output from the three divide-by-three dividers 13A of leaf nodes.

Similarly, the phase distribution circuit 10B includes a plurality of divide-by-three dividers 13B. The divide-by-three dividers 13B are connected in a tree structure.

Specifically, one of the divide-by-three dividers 13B of root nodes of the phase distribution circuit 10B outputs three signals each having a phase that is shifted by 2π/3 from one another. Then, the other three divide-by-three dividers 13B of leaf nodes of child nodes receive the three signals. A signal B input to the divide-by-three dividers 13B of root nodes is divided into nine, and nine signals each having a different phase are output from the three divide-by-three dividers 13B of leaf nodes.

The divide-by-three dividers 13A and 13B each may be, e.g., a shift register.

The time-to-digital converter of this embodiment includes time-to-digital conversion circuits 20. The time-to-digital conversion circuits 20 each includes two input ports connected with a pair of signals that are output from the phase distribution circuits 10A and 10B. This pair of signals have the same edge number. Specifically, the time-to-digital conversion circuits 20 each converts a phase difference to a digital value. This phase difference is between the signals of φi (where i is an integer from 0 to 8) that are output from the phase distribution circuits 10A and 10B. Then, the time-to-digital conversion circuits 20 each outputs the digital value as a digital signal D_i. The time-to-digital conversion circuit 20 may have any configuration and resolution.

As described above, in the time-to-digital converter of this embodiment, the divide-by-three dividers 13A and 13B are connected in a tree structure to form the phase distribution circuits 10A and 10B, respectively, thereby the divide-by-three dividers 13A and 13B of lower child nodes have a lower operating frequency reduced by ⅓. Thus, the phase distribution circuits 10A and 10B can operate with low power consumption. The divide-by-three dividers 13A and 13B in a tree structure also easily provide equal-length wiring. Thus, the edges can be distributed without offset errors unnecessary for the time axis signal. The time-to-digital conversion circuit 20 also receives a signal of a 50% duty cycle, and thus easily secures a settling time.

Third Embodiment

Figure 4:
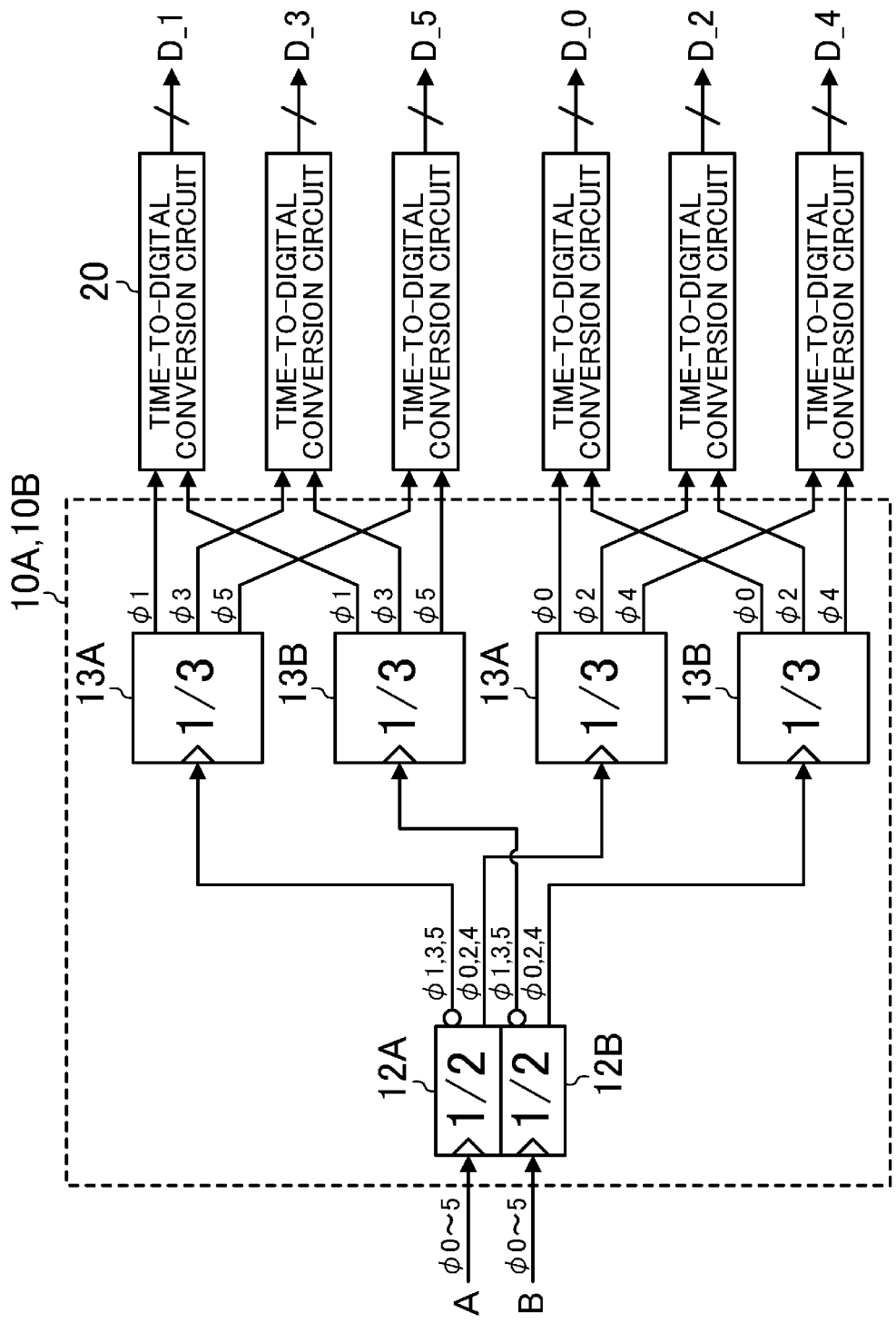
FIG. 4 is a block diagram of a time-to-digital converter of a third embodiment.

FIG. 4 illustrates a configuration of a time-to-digital converter of a third embodiment. The time-to-digital converter of this embodiment includes phase distribution circuits 10A and 10B that differ from those of the first embodiment. In particular, the differences from the first embodiment will be described below.

The phase distribution circuit 10A includes a divide-by-two divider 12A and divide-by-three dividers 13A. The divide-by-two divider 12A and the divide-by-three dividers 13A are connected in a tree structure. Specifically, the divide-by-two divider 12A of a root node of the phase distribution circuit 10A outputs an in-phase output and a reverse phase to the two divide-by-three dividers 13A of leaf nodes of child nodes. A signal A input to the divide-by-two divider 12A of a root node is divided into six, and six signals each having a different phase are output from the two divide-by-three dividers 13A of leaf nodes.

Similarly, the phase distribution circuit 10B includes a divide-by-two divider 12B and divide-by-three dividers 13B. The divide-by-two divider 12B and the divide-by-three dividers 13B are connected in a tree structure. Specifically, the divide-by-two divider 12B of a root node of the phase distribution circuit 10B outputs an in-phase output and a reverse phase output to the two divide-by-three dividers 13B of leaf nodes of child nodes. A signal B input to the divide-by-two divider 12B of a root node is divided into six, and six signals each having a different phase are output from the two divide-by-three dividers 13B of leaf nodes.

The time-to-digital converter of this embodiment includes time-to-digital conversion circuits 20. The time-to-digital conversion circuits 20 each includes two input ports connected with a pair of signals that are output from the phase distribution circuits 10A and 10B. This pair of signals have the same edge number. Specifically, the time-to-digital conversion circuits 20 each converts a phase difference into a digital value. This phase difference is between the signals of ϕi (where i is an integer from 0 to 5) that are output from the phase distribution circuits 10A and 10B. Then, the time-to-digital conversion circuits 20 each outputs the digital value as a digital signal D_i. The time-to-digital conversion circuit 20 may have any configuration and resolution.

As this embodiment shows, the divide-by-two dividers 12A and 12B and the divide-by-three dividers 13A and 13B are connected in a tree structure to form the phase distribution circuits 10A and 10B, thereby the frequency dividers (the divide-by-three dividers 13A and 13B in this embodiment) of lower child nodes have lower operating frequencies. Thus, the phase distribution circuits 10A and 10B can operate with low power consumption. The divide-by-two divider 12A and the divide-by-three dividers 13A, and the divide-by-two divider 12B and the divide-by-three dividers 13B are connected in a tree structure, respectively, thereby easily providing equal-length wiring. Thus, the edges can be distributed without offset errors unnecessary for the time axis signal. The time-to-digital conversion circuit 20 also receives a signal of a 50% duty cycle, and thus easily secures a settling time.

Fourth Embodiment

Figure 5:
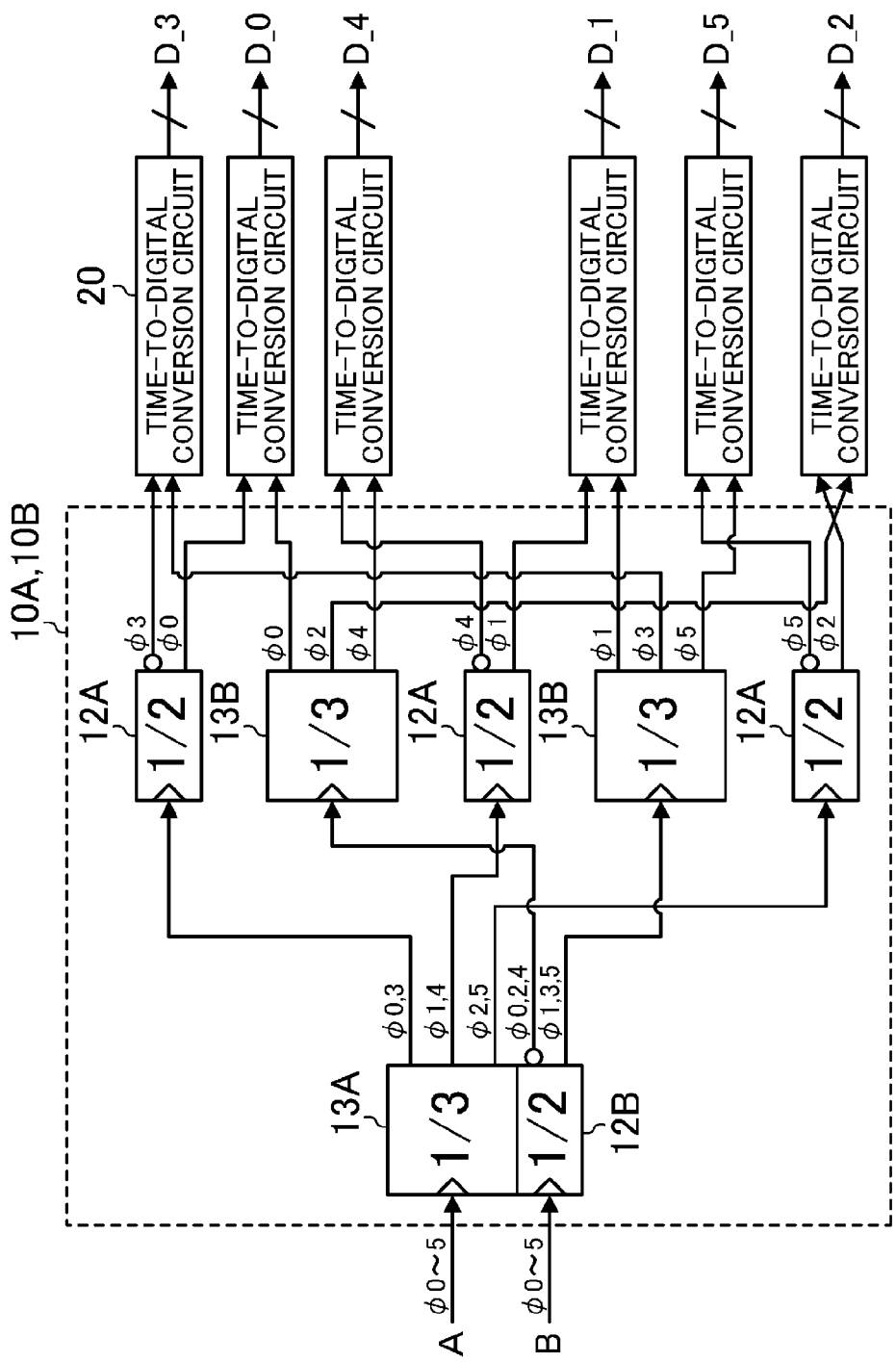
FIG. 5 is a block diagram of a time-to-digital converter of a fourth embodiment.

FIG. 5 illustrates a configuration of a time-to-digital converter of a fourth embodiment. The time-to-digital converter of this embodiment includes phase distribution circuits 10A and 10B that differ from those of the third embodiment. In particular, the differences from the third embodiment will be described below.

The phase distribution circuit 10A includes a divide-by-three divider 13A and divide-by-two dividers 12A. The divide-by-three divider 13A and the divide-by-two dividers 12A are connected in a tree structure. Specifically, the divide-by-three divider 13A of a root node of the phase distribution circuit 10A distributes three outputs to the three divide-by-two dividers 12A of leaf nodes of child nodes. A signal A is input to the divide-by-three divider 13A of a root node is divided into six, and six signals each having a different phase are output from the three divide-by-two dividers 12A of leaf nodes.

On the other hand, similarly to the second embodiment, the phase distribution circuit 10B includes a divide-by-two divider 12B and divide-by-three dividers 13B. The divide-by-two divider 12B and the divide-by-three dividers 13B are connected in a tree structure. Specifically, the divide-by-two divider 12B of a root node of the phase distribution circuit 10B outputs an in-phase output and a reverse phase output to the two divide-by-three dividers 13B of leaf nodes of child nodes. A signal B input to the divide-by-two divider 12B of a root node is divided into six, and six signals each having a different phase are output from the two divide-by-three dividers 13B of leaf nodes.

The time-to-digital converter of this embodiment includes time-to-digital conversion circuits 20. The time-to-digital conversion circuits 20 each includes two input ports connected with a pair of signals that are output from the phase distribution circuits 10A and 10B. This pair of signals have the same edge number. Specifically, the time-to-digital conversion circuits 20 each converts a phase difference to a digital value. This phase difference is between the signals of ϕi (where i is an integer from 0 to 5) that are output from the phase distribution circuits 10A and 10B. Then, the time-to-digital conversion circuits 20 each outputs a digital signal D_i. The time-to-digital conversion circuit 20 may have any configuration and resolution.

As this embodiment shows, even if the divide-by-two divider 12A and the divide-by-three dividers 13A are connected in a different sequence in the phase distribution circuits 10A and 10B, respectively, the frequency dividers (in this embodiment, the divide-by-two dividers 12A and 12B of the phase distribution circuit 10A, and the divide-by-three dividers 13A and 13B of the phase distribution circuit 10B) of lower child nodes have lower operating frequencies. Thus, the phase distribution circuits 10A and 10B can operate with low power consumption. The divide-by-two dividers 12A and 12B and the divide-by-three dividers 13A and 13B in a tree structure also easily provide equal-length wiring. Thus, the edges can be distributed without offset errors unnecessary for the time axis signal. The time-to-digital conversion circuit 20 also receives a signal of a 50% duty cycle, and thus secures a settling time.

Fifth Embodiment

Figure 6:
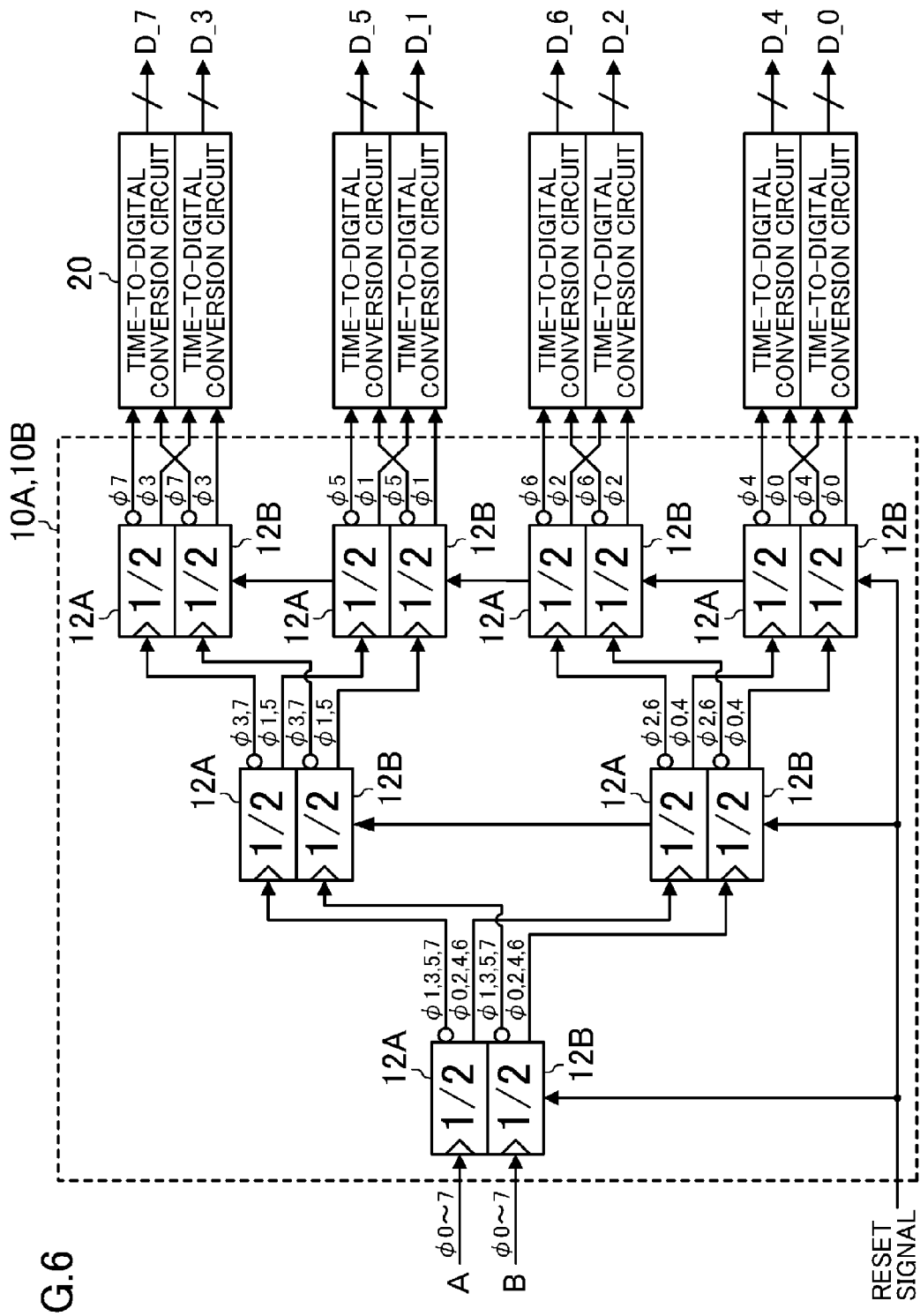
FIG. 6 is a block diagram of a time-to-digital converter of a fifth embodiment.

FIG. 6 illustrates a configuration of a time-to-digital converter of a fifth embodiment. The time-to-digital converter of this embodiment includes the divide-by-two dividers 12A and 12B of the phase distribution circuits 10A and 10B of the time-to-digital converter of the first embodiment. The divide-by-two dividers 12A and 12B of the fifth embodiment can also be initialized with a reset signal.

The divide-by-two dividers 12A and 12B each distributes an output that starts from either a rising edge or a falling edge. The choice between the rising edge and the falling edge often depends on the initial state of each of the divide-by-two dividers 12A and 12B. Thus, all the divide-by-two dividers 12A and 12B each requires an initial operation programed in advance. The time-to-digital converter of this embodiment includes the phase distribution circuits 10A and 10B including the divide-by-two dividers 12A and 12B that can be initialized together with a reset signal. This configuration allows the time axis signal to be distributed in a fixed sequence, and enables a stable operation of the time-to-digital converter.

The time-to-digital converters of the embodiments other than this embodiment may also include the phase distribution circuits 10A and 10B including the divide-by-two dividers 12A and 12B and the divide-by-three dividers 13A and 13B that are initialized with a reset signal.

The embodiments of the time-to-digital converter have been described above. In those embodiments, the phase distribution circuits 10A and 10B include the divide-by-two dividers 12A and 12B and/or the divide-by-three dividers 13A and 13B. Alternatively, the phase distribution circuits 10A and 10B may include frequency dividers each dividing a signal into any number and connected in a tree structure.

Sixth Embodiment

Figure 7:
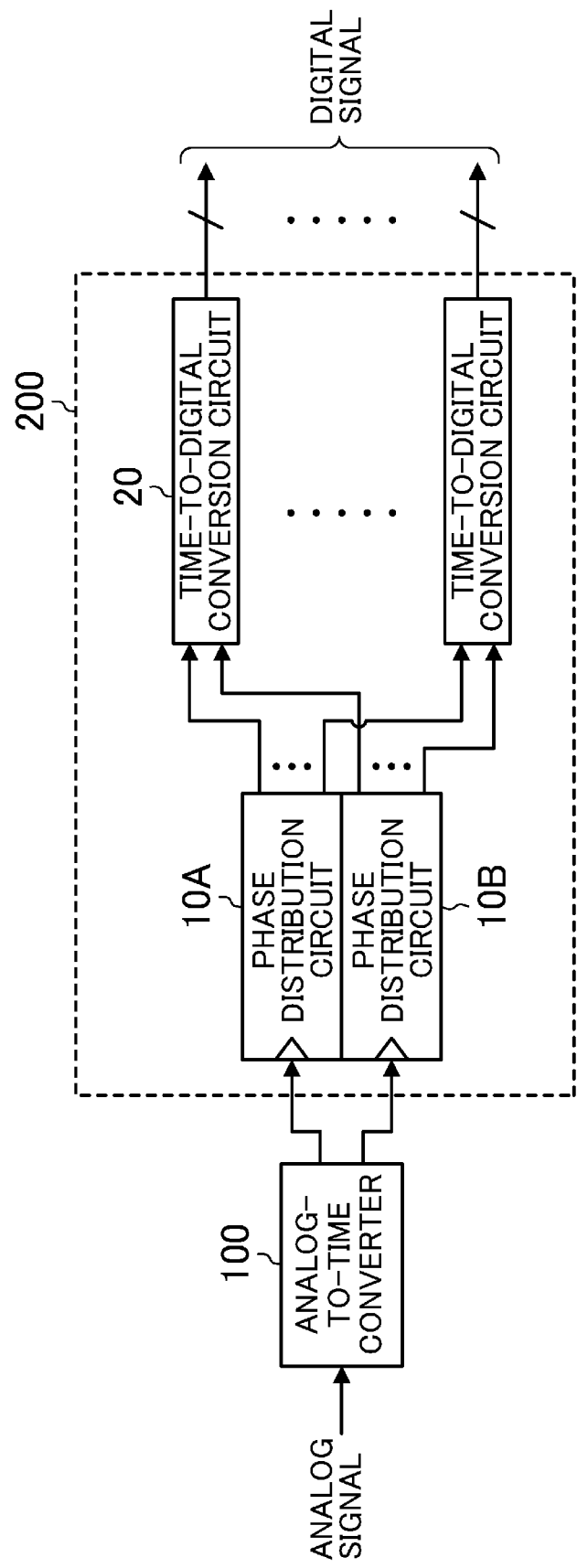
FIG. 7 is a block diagram of an A/D converter of a sixth embodiment.

FIG. 7 illustrates a configuration of an A/D converter of a sixth embodiment. The A/D converter of this embodiment includes an analog-to-time converter 100 and a time-to-digital converter 200. The analog-to-time converter 100 receives an analog signal and converts an analog quantity of the analog signal into a phase difference between two signals. The time-to-digital converter 200 converts this phase difference between the two signals into a digital value. In other words, the A/D converter of this embodiment converts the analog signal to the time axis information and converts it into digital form. The time-to-digital converter 200 is any one of the time-to-digital converters of the above-described embodiments.

The analog signal may be either a voltage signal or a current signal. The analog signal may also be a single-ended signal or a differential signal. The analog-to-time converter 100 may have any circuit configuration. For example, the analog-to-time converter 100 is activated with a sampling clock signal (not shown). Then, the analog-to-time converter 100 modulates the analog quantity of the input signal into the edge interval between the two signals. Then, the analog-to-time converter 100 outputs the two signals.

As described above, the A/D converter of this embodiment includes the time-to-digital converter 200 operating with low power consumption. In other words, the A/D converter requires low power consumption as a whole. The time-to-digital converter 200 also includes the phase distribution circuits 10A and 10B with high precision in the phase distribution. Thus, the A/D converter has an improved significant bit.

As described above, the first to sixth embodiments have been described as example techniques disclosed in the present application. However, the techniques according to the present disclosure are not limited to these embodiments, but are also applicable to those where modifications, substitutions, additions, and omissions are made. In addition, elements described in the first to sixth embodiments may be combined to provide a different embodiment.

Various embodiments have been described above as example techniques of the present disclosure, in which the attached drawings and the detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential. Since the embodiments described above are intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A time-to-digital converter, comprising:
first and second phase distribution circuits:
    each including a plurality of frequency dividers connected in a tree structure,
    each dividing a signal received by the frequency dividers of root nodes into N signals, and
    each outputting the N signals each having a different phase; and
N time-to-digital conversion circuits:
    each converting a phase difference between an i-th signal (where i is an integer from 0 to N−1) that is output from the first phase distribution circuit and another i-th signal that is output from the second phase distribution circuit into a digital value,
wherein the plurality of frequency dividers are initialized with a reset signal.

2. A time-to-digital converter, comprising:
first and second phase distribution circuits:
    each including a plurality of frequency dividers connected in a tree structure,
    each dividing a signal received by the frequency dividers of root nodes into N signals, and
    each outputting the N signals each having a different phase; and
N time-to-digital conversion circuits:
    each converting a phase difference between an i-th signal (where i is an integer from 0 to N−1) that is output from the first phase distribution circuit and another i-th signal that is output from the second phase distribution circuit into a digital value,
wherein each of the plurality of frequency dividers includes a divide-by-two divider, and
the plurality of frequency dividers are initialized with a reset signal.

3. An A/D converter, comprising:
a time-to-digital converter, comprising:
    first and second phase distribution circuits:
        each including a plurality of frequency dividers connected in a tree structure,
        each dividing a signal received by the frequency dividers of root nodes into N signals, and
        each outputting the N signals each having a different phase; and
    N time-to-digital conversion circuits:
        each converting a phase difference between an i-th signal (where i is an integer from 0 to N−1) that is output from the first phase distribution circuit and another i-th signal that is output from the second phase distribution circuit into a digital value; and
an analog-to-time converter configured to convert an analog quantity of an input signal into a phase difference between two signals, wherein
the analog-to-time converter outputs the two signals,
one of the two signals is input to the first phase distribution circuit of the time-to-digital converter, and
the other one of the two signals is input to the second phase distribution circuit of the time-to-digital converter.

4. An A/D converter, comprising:
a time-to-digital converter, comprising:
    first and second phase distribution circuits:
        each including a plurality of frequency dividers connected in a tree structure,
        each dividing a signal received by the frequency dividers of root nodes into N signals, and
        each outputting the N signals each having a different phase; and
    N time-to-digital conversion circuits:
        each converting a phase difference between an i-th signal (where i is an integer from 0 to N−1) that is output from the first phase distribution circuit and another i-th signal that is output from the second phase distribution circuit into a digital value, and an analog-to-time converter configured to convert an analog quantity of an input signal into a phase difference between two signals, wherein each of the plurality of frequency dividers includes a divide-by-two divider, the analog-to-time converter outputs the two signals, one of the two signals is input to the first phase distribution circuit of the time-to-digital converter, and the other one of the two signals is input to the second phase distribution circuit of the time-to-digital converter.

5. An A/D converter, comprising:

the time-to-digital converter of claim 1; and an analog-to-time converter configured to convert an analog quantity of an input signal into a phase difference between two signals, wherein the analog-to-time converter outputs the two signals, one of the two signals is input to the first phase distribution circuit of the time-to-digital converter, and the other one of the two signals is input to the second phase distribution circuit of the time-to-digital converter.

* * * * *